US007018773B2

(12) United States Patent
Mori

(10) Patent No.: US 7,018,773 B2
(45) Date of Patent: Mar. 28, 2006

(54) PRINTING PLATE MATERIAL AND IMAGE FORMATION METHOD EMPLOYING THE SAME

(75) Inventor: Takahiro Mori, Hachioji (JP)

(73) Assignee: Konica Corporation, Tokyo (JP)

( * ) Notice: Subject to any disclaimer, the term of this patent is extended or adjusted under 35 U.S.C. 154(b) by 93 days.

(21) Appl. No.: 10/669,076

(22) Filed: Sep. 22, 2003

(65) Prior Publication Data

US 2004/0157150 A1 Aug. 12, 2004

(30) Foreign Application Priority Data

Sep. 30, 2002 (JP) ............................ 2002-285345

(51) Int. Cl.
*G03F 7/11* (2006.01)

(52) U.S. Cl. .............................. 430/270.1; 430/271.1; 430/283.1; 430/292; 430/302; 430/309; 430/434; 430/435; 430/494; 430/944; 430/945

(58) Field of Classification Search ............ 430/270.1, 430/271.1, 283.1, 292, 302, 309, 434, 435, 430/494, 944, 945
See application file for complete search history.

(56) References Cited

U.S. PATENT DOCUMENTS

| | | | | |
|---|---|---|---|---|
| 6,399,270 | B1 * | 6/2002 | Mori et al. | 430/270.1 |
| 2002/0051931 | A1 | 5/2002 | Mori et al. | |
| 2004/0055490 | A1 * | 3/2004 | Sampei | 101/458 |
| 2004/0103805 | A1 * | 6/2004 | Mori | 101/459 |

FOREIGN PATENT DOCUMENTS

| | | | |
|---|---|---|---|
| EP | 0 916 513 | A2 | 5/1999 |
| EP | 1 046 513 | A2 | 10/2000 |
| EP | 1 057 622 | A2 | 12/2000 |
| EP | 1 108 533 | A1 | 6/2001 |

* cited by examiner

*Primary Examiner*—Barbara L. Gilliam
(74) *Attorney, Agent, or Firm*—Frishauf, Holtz, Goodman & Chick, P.C.

(57) ABSTRACT

Disclosed are a printing plate material comprising a substrate and provided thereon, a component layer comprising a hydrophilic layer and an image formation layer, the hydrophilic layer being provided closer to the substrate than the image formation layer, wherein the hydrophilic layer contains an electron providing dye precursor, the image formation layer contains an organic electron accepting developing agent, and the component layer contains a light heat conversion material.

14 Claims, No Drawings

PRINTING PLATE MATERIAL AND IMAGE FORMATION METHOD EMPLOYING THE SAME

FIELD OF THE INVENTION

The present invention relates to a printing plate material capable of forming an image by a computer to plate (CTP) system and an image formation method employing the same.

BACKGROUND OF THE INVENTION

The printing plate material for CTP, which is inexpensive, can be easily handled, and has a printing ability comparable with that of a PS plate, is required accompanied with the digitization of printing data. Recently, a versatile thermal processless printing plate material has been noticed which can be applied to a printing press employing a direct imaging (DI) process without development by a special developing agent, and treated in the same manner as in PS plates.

As the thermal processless printing plate material is cited Thermo Lite described above produced by Agfa Co., Ltd. This plate material is one for short run and its printing durability only provides prints of about 30,000 sheets of coated paper. Since plate inspection after thermal laser exposure is not specifically considered, there is no exposure image visualization property in this plate material.

In contrast, it is printing durability such that a print is made on at least 100,000 sheets of coated paper and image visualization after image recording, as well as the same various printing performances as PS plates, which is requested in the versatile processless printing plate material.

It is expected in the CTP system that procedure of plate inspection will be not carried out in future. However, the plate inspection is still necessary in the present working procedures. Therefore, in the thermal processless printing plate material, image visualization after image recording is necessary, and particularly when a thermal laser is employed for exposure, exposure image visualization is one of the important performances.

In order to form an image for a thermal processless type printing plate material, a thermal laser recording method is used in which the laser emits light having infrared to near-infrared wavelength regions. The processless type printing plate material capable forming an image according to this method is divided into two kinds of printing plate materials described later, an ablation type printing plate material, and a development-on-press type printing plate material which forms a heat fusible image on a printing press.

As the ablation type printing plate materials are cited printing plate materials disclosed in Japanese Patent O.P.I. Publication Nos. 8-507727, 6-186750, 6-199064, 7-314934, 10-58636 and 10-244773.

These printing plate materials comprise a substrate and a hydrophilic layer and an oleophilic layer provided thereon, either of which is an outer layer. When the outer layer is the hydrophilic layer, the printing plate material is imagewise exposed to ablate the hydrophilic layer to imagewise remove it, whereby the oleophilic layer is unveiled to form image portions at the unveiled portions. However, there are problems that the ablated outer layer scatters and contaminates the exposure device. Therefore, a method is proposed in which a water soluble protective layer is provided on the outer layer, whereby the protective layer prevents the ablated layer from scattering and the ablated layer is removed together with the protective layer on a printing press.

In order to improve printing durability of the ablation type printing plate material, strength of the outer layer need be increased. However, when the printing durability is improved, it lowers sensitivity or resolution degree of images, and therefore, it is difficult to improve printing durability without lowering sensitivity or resolution degree of images.

It is possible to give exposure image visualization to a printing plate material employing an outer layer and a lower layer under the outer layer different in hues from each other. However, in order to realize the visualization, it is necessary to completely ablate and remove the outer layer. This can be realized by suctioning the ablated layer, for example, through a cleaner installed in an exposure device, but the cleaner install results in cost increase.

In the printing plate material described above in which the protective layer is provided, even if hues of the outer layer and the lower layer are different, good exposure image visualization cannot be obtained due to residual ablated layer.

In order to solve the above problem, there has been proposed, for example, in Japanese Patent O.P.I. Publication No. 2002-205466, a printing plate material comprising a hydrophilic overcoat layer, which is capable of being removed on a printing press, containing not less than 20% by weight of a cyanine infrared absorbing dye whose optical density varies due to exposure. This gives good exposure image visualization, and whether a color density of the dye image increases or decreases due to exposure, either exposed potions or unexposed portions exhibit a high color density, however, it is apparent that the high dye content of the layer to be removed on a printing press results in contamination of the printing press due to development on press.

As the development-on-press type printing plate material which forms a heat fusible image on a press, a printing plate material disclosed in JP-2938397 is cited which comprises a hydrophilic layer or a grained aluminum plate and provided thereon, an image forming layer containing thermoplastic particles and a water soluble binder. The Thermo Lite described above produced by Agfa Co., Ltd. is this type of a processless printing plate material.

In order to improve initial printability, a method is considered which increases a content of the water soluble binder in the image forming layer described above. The water soluble binder amount in the image forming layer increased to obtain good initial printability inhibits heat fusibility of the thermoplastic particles. Therefore, this method is difficult to obtain both good initial printability and good image formation.

In order to improve resistance to stain due to scratch (also referred to scratch resistance), it is necessary to prevent lowering of developability on a printing press due to pressure of the thermoplastic particles. Such a method described above in which the water soluble binder content in the image forming layer is increased, or thermoplastic particles of high Tg with high hardness are employed, tends to inhibit image formation, and is difficult to obtain a printing plate material with good scratch resistance and good image formation property.

As a method providing exposure image visualization, a method (as disclosed, for example, in Japanese Patent O.P.I. Publication No. 11-240270) is cited which employs a color fading property due to exposure of an infrared absorbing dye.

As is aforementioned, it has been difficult for prior art to give excellent initial printability, excellent scratch resistance and excellent exposure image visualization to the processless printing plate material.

SUMMARY OF THE INVENTION

An object of the present invention is to provide a printing plate material exhibiting excellent initial printability, excellent scratch resistance, and excellent exposure image visualization, as a processless printing plate material, and to provide an image formation method free from contamination of a printing press when printing is carried out employing a development-on-press type printing plate material.

DETAILED DESCRIPTION OF THE INVENTION

The above object has been attained by one of the following constitutions:

1. A printing plate material comprising a substrate and provided thereon, a component layer comprising a hydrophilic layer and an image formation layer, the hydrophilic layer being provided closer to the substrate than the image formation layer, wherein the hydrophilic layer contains an electron providing dye precursor, the image formation layer contains an organic electron accepting developing agent, and the component layer contains a light heat conversion material.

2. The printing plate material of item 1 above, wherein the image formation layer contains a heat melting material with a melting point of 60 to 200° C.

3. The printing plate material of item 2 above, wherein the heat melting material is such that it alone does not exhibit ink receptivity, and when it is heat melted and mixed with the electron providing dye precursor or the electron accepting developing agent, it exhibits ink receptivity.

4. The printing plate material of item 3 above, wherein the heat melting material is a fatty acid amide.

5. The printing plate material of item 1 above, wherein the image formation layer contains a water soluble material.

6. The printing plate material of item 1 above, wherein the hydrophilic layer is porous.

7. The printing plate material of item 1 above, wherein the electron providing dye precursor has a melting point of 50 to 300° C., and the electron accepting developing agent has a melting point of 50 to 300° C.

8. The printing plate material of item 7 above, wherein the electron providing dye precursor has a melting point of 100 to 200° C., and the electron accepting developing agent has a melting point of 100 to 200° C.

9. The printing plate material of item 1 above, wherein the coating amount of the electron providing dye precursor is from 0.05 to 1 $g/m^2$ of the printing plate material.

10. The printing plate material of item 1 above, wherein the amount of the organic electron accepting developing agent is from 0.05 to 2 $g/m^2$ of the printing plate material.

11. The printing plate material of item 1 above, wherein the hydrophilic layer contains a metal oxide having an average particle size of from 3 to 100 nm.

12. The printing plate material of item 1 above, wherein the component layer is comprised of the hydrophilic layer, and the image formation layer.

13. A printing plate material comprising a substrate and provided thereon, a component layer comprising a hydrophilic layer and an image formation layer, the hydrophilic layer being provided closer to the substrate than the image formation layer, wherein the component layer contains a light heat conversion material, a fatty acid amide, and a substance, which when it is heat melted and mixed with the fatty acid amide, exhibits ink receptivity.

14. The printing plate material of item 13 above, wherein the substance is an electron providing dye precursor or an organic electron accepting developing agent.

15. An image formation method comprising the steps of:

exposing the printing plate material of item 1 above, employing an infrared laser;

melting the organic electron accepting developing agent at exposed portions so that the melted agent permeates the hydrophilic layer to form a color image in the hydrophilic layer; and then removing the image formation layer at unexposed portions.

16. The image formation method of item 15 above, wherein the removing is carried out on a printing press employing a dampening water or a printing ink.

17. The image formation method of item 15 above, wherein the exposing is carried out employing infrared laser installed in a printing press.

2-1. A printing plate material comprising a substrate and provided thereon, a hydrophilic layer and an image formation layer in that order, wherein the hydrophilic layer contains an electron providing dye precursor, the image formation layer contains an organic electron accepting developing agent, and at least one layer provided on the substrate comprises a light heat conversion material.

2-2. The printing plate material of item 2-1 above, wherein the image formation layer contains a heat melting material with a melting point of 60 to 200° C.

2-3. The printing plate material of item 2-2 above, wherein the heat melting material is such that it alone does not exhibit ink receptivity, and when it is heat melted and mixed with the electron providing dye precursor or the electron accepting developing agent, it exhibits ink receptivity.

2-4. The printing plate material of item 2-3 above, wherein the heat melting material is a fatty acid amide.

2-5. The printing plate material of any one of items 2-1 through 2-4 above, wherein the image formation layer contains a water soluble material.

2-6. The printing plate material of any one of items 2-1 through 2-5 above, wherein the hydrophilic layer is porous.

2-7. A printing plate material comprising a substrate and provided thereon, a hydrophilic layer and an image formation layer in that order, wherein at least one layer provided on the substrate contains a light heat conversion material, a fatty acid amide, and a substance, which when it is heat melted and mixed with the fatty acid amide, exhibits ink receptivity.

2-8. The printing plate material of item 2-7 above, wherein the substance is an electron providing dye precursor or an organic electron accepting developing agent.

2-9. An image formation method comprising the steps of exposing the printing plate material of any one of items 2-1 through 2-8 above employing an infrared laser, melting the organic electron accepting developing agent at exposed portions so that the melted agent permeates the hydrophilic layer to form a color image in the hydrophilic layer, and then removing at least a part of the image formation layer.

2-10. The image formation method of item 2-9 above, wherein the removing is carried out on a printing press employing a dampening water or a printing ink.

2-11. The image formation method of item 2-9 or 2-10 above, wherein the exposing is carried out in a printing press.

The present invention will be detailed below.

The present invention is a printing plate material comprising a substrate and provided thereon, a component layer comprising a hydrophilic layer and an image formation layer, the hydrophilic layer being provided closer to the substrate than the image formation layer, wherein the hydrophilic layer contains an electron providing dye precursor, the image formation layer contains an organic electron accepting developing agent, and the component layer contains a light heat conversion material. The component layer is comprised of the hydrophilic layer, the image formation layer, and another layer, (which is a layer other than the hydrophilic layer or the image formation layer), and is preferably comprised of the hydrophilic layer and the image formation layer.

The printing plate material of the invention can form an image by heat. The image formation method of the invention comprises the steps of melting the organic electron accepting developing agent in the image formation layer by applying heat so that the melted agent permeates the hydrophilic layer and is brought into contact with the electron providing dye precursor in the hydrophilic layer to form a color image in the hydrophilic layer. When the melted agent is brought into contact with the electron providing dye precursor, it is preferred in obtaining a better color image that the electron providing dye precursor is also melted by applying heat and mixed with the melted agent. The electron providing dye precursor has a melting point of preferably from 50 to 300° C., and more preferably from 100 to 200° C. As the electron providing dye precursor, known precursors, which are used in a conventional thermal recording paper, can be used.

Examples of the electron providing dye precursor include a triarylmathane compound such as crystal violet lactone, a diphenylmethane compound such as leuco auramine, a spiropiran compound, a fluoran compound, a rhodamine lactam compound, and a carbazolylmethane compound. Further, compounds represented by formula (1) disclosed in Japanese Patent O.P.I. Publication No. 6-210947 can be used as the electron providing dye precursor.

In the invention, the hydrophilic layer contains an electron providing dye precursor, and preferably contains a metal oxide described later which can function as an electron accepting developing agent, and therefore, it is preferred that the electron providing dye precursor is one which is difficult to form a dye when it is in contact with the metal oxide. Examples of such an electron providing dye precursor include a compound capable of being colored in black, which is generally known as ODB or ODB-2, produced by Yamamoto Kasei Co., Ltd.

It is preferred that the electron providing dye precursor is dispersed in the hydrophilic layer in the form of particles. The average particle size of the electron providing dye precursor particles is from 0.01 to 10 μm, preferably from 0.1 to 5 μm, and more preferably from 0.2 to 2 μm. The electron providing dye precursor particles can be obtained as an aqueous electron providing dye precursor dispersion, which is prepared by a known wet dispersion method, for example, by dispersing the electron providing dye precursor with a dispersant in a sand grinder.

Examples of the dispersant include known (nonionic or anionic) surfactants and water soluble polymers. Among the water soluble polymers, methylcellulose, carboxymethylcellulose, hydroxypropylmethylcellulose, polyethylene glycol, polyethylene glycol fatty acid ester, polyoxyethylenealkylether sulfate, and 2-ethylhexylsulfosuccinate sodium salt are preferred.

The electron providing dye precursor content of the hydrophilic layer is from 1 to 50% by weight, and preferably from 2 to 30% by weight. The electron providing dye precursor content less than 1% by weight cannot provide a sufficient color density in a hydrophilic layer with a proper thickness range described later. The electron providing dye precursor content falling within the above range is preferred in view of a color density of formed images, mechanical strength or hydrophilicity of the hydrophilic layer is lowered, and prevention of stain occurrence. The coating amount of the electron providing dye precursor is preferably from 0.05 to 1 $g/m^2$, and more preferably from 0.1 to 0.5 $g/m^2$ of the printing plate material.

As the organic electron accepting developing agent used in the image formation layer in the invention, known developing agents, which are used in a conventional thermal recording paper and disclosed in Japanese Patent O.P.I. Publication Nos. 6-99663, 7-52551, and 8-258420, are preferably used. For example, include acidic compounds such as a phenol compound, a thiophenol compound, a thiourea derivative, an organic acid or its metal salt, and oxyesters are preferably used.

Examples thereof include bisphenols suc as 2,2-bis(4'-hydroxyphenyl)propane (called bisphenol A), 2,2-bis(4'-hydroxyphenyl)pentane, 2,2-bis(4'-hydroxy-3',5'-dichlorophenyl)propane, 1,1-bis(4'-hydroxyphenyl)cyclohexane, 2,2-bis(4'-hydroxyphenyl)hexane, 1,1-bis(4'-hydroxyphenyl)propane, 1,1-bis(4'-hydroxyphenyl)butane, 1,1-bis(4'-hydroxyphenyl)pentane, 1,1-bis(4'-hydroxyphenyl)hexane, 1,1-bis(4'-hydroxyphenyl)heptane, 1,1-bis(4'-hydroxyphenyl)octane, 1,1-bis(4'-hydroxyphenyl)-2-methylpentane, 1,1-bis(4'-hydroxyphenyl)-2-ethylhexane, 1,1-bis(4'-hydroxyphenyl)dodecane, 1,4-bis(p-hydroxyphenylcumyl)benzene, 1,3-bis(p-hydroxyphenylcumyl)benzene, bis(p-hydroxyphenyl)sulfone, bis(3-allyl-4-hydroxyphenyl)sulfone, and bis(p-hydroxyphenyl)acetic acid benzyl ester; salicylic acid derivatives such as 3,5-di-α-methylbenzylsalicylic acid, 3,5-di-t-butylsalicylic acid, 3-α,α-dimethylbenzylsalicylic acid, 4-(β-p-dimethoxyphenoxyethoxy)salicylic acid and their polyvalent metal (particularly, zinc, aluminum is preferred) salts; oxybenzoic acid esters such as p-hydroxybenzoic acid benzyl ester, p-hydroxybenzoic acid 2-ethylhexyl ester, and β-resorcylic acid-(2-phenoxyethyl) ester; and phenols such as p-phenylphenol, 3,5-diphenylphenol, cumylphenol, 4-hydroxy-4'-isopropoxy-diphenyl sulfone, and 4-hydroxy-4'-phenoxy-diphenyl sulfone, but are not limited thereto.

As the electron accepting developing agent, organophosphorous compounds having a long chain aliphatic hydrocarbon group, aliphatic carboxylic acid compounds, and phenols, which are disclosed in Japanese Patent O.P.I. Publication Nos. 5-124360, 6-210954, and 2002-19295, can be used. The long chain aliphatic hydrocarbon group provides a printing plate which increases strength of the image portions, and solvent resistance due to strong cohesive force of the group, resulting in improved printing durability.

The organic electron accepting developing agent has a melting point of preferably from 50 to 300° C., and more preferably from 100 to 200° C.

The organic electron accepting developing agent content of the hydrophilic layer is from 1 to 50% by weight, and preferably from 2 to 30% by weight. The organic electron accepting developing agent content less than 1% by weight lowers color developing capability and cannot provide a sufficient color density. The organic electron accepting developing agent content falling within the above range is preferred in obtaining images with a sufficient strength. The coating amount of the organic electron accepting developing agent is preferably from 0.05 to 2 $g/m^2$, and more preferably from 0.1 to 1 $g/m^2$ of the printing plate material.

In the printing plate material of the invention, at least one of layers constituting the component layer contains a light heat conversion material. The layer constituting the component layer contains a light heat conversion material in an amount of preferably from 0.1 to 60% by weight, more preferably from 0.5 to 30% by weight, and still preferably from 1 to 20% by weight, based on the layer weight. As the light heat conversion materials, the following compounds will be cited. It is preferred that compounds providing a high color density such as black pigment be contained in the hydrophilic layer.

Examples of pigment include carbon, graphite, a metal and a metal oxide. Furnace black and acetylene black is preferably used as the carbon. The graininess ($d_{50}$) thereof is preferably not more than 100 nm, and more preferably not more than 50 nm. The graphite is one having a particle size of preferably not more than 0.5 μm, more preferably not more than 100 nm, and most preferably not more than 50 nm. As the metal, any metal can be used as long as the metal is in a form of fine particles having preferably a particle size of not more than 0.5 μm, more preferably not more than 100 nm, and most preferably not more than 50 nm. The metal may have any shape such as spherical, flaky and needle-like. Colloidal metal particles such as those of silver or gold are particularly preferred.

As the metal oxide, materials having black color in the visible regions or materials which are electro-conductive or semi-conductive can be used. Examples of the former include black iron oxide ($Fe_3O_4$), and black complex metal oxides containing at least two metals. Examples of the latter include Sb-doped $SnO_2$ (ATO), Sn-added $In_2O_3$ (ITO), $TiO_2$, TiO prepared by reducing $TiO_2$ (titanium oxide nitride, generally titanium black). Particles prepared by covering a core material such as $BaSO_4$, $TiO_2$, $9Al_2O_3.2B_2O$ and $K_2O.nTiO_2$ with these metal oxides is usable. The particle size of these particles is preferably not more than 0.5 μm, more preferably not more than 100 nm, and most preferably not more than 50 nm.

Among these light heat conversion materials, black complex metal oxides containing at least two metals are preferred. Typically, the black complex metal oxides include complex metal oxides comprising at least two selected from Al, Ti, Cr, Mn, Fe, Co, Ni, Cu, Zn, Sb, and Ba. These can be prepared according to the methods disclosed in Japanese Patent O.P.I. Publication Nos. 9-27393, 9-25126, 9-237570, 9-241529 and 10-231441.

The complex metal oxide is preferably a complex Cu—Cr—Mn type metal oxide or a Cu—Fe—Mn type metal oxide. The Cu—Cr—Mn type metal oxides are preferably subjected to the treatment disclosed in Japanese Patent O.P.I. Publication Nos. 8-27393 in order to reduce isolation of a 6-valent chromium ion. These complex metal oxides have a high color density and a high light heat conversion efficiency as compared with another metal oxide.

The primary average particle size of these complex metal oxides is preferably from 0.001 to 1.0 μm, and more preferably from 0.01 to 0.5 μm. The primary average particle size of from 0.001 to 1.0 μm improves a light heat conversion efficiency relative to the addition amount of the particles, and the primary average particle size of from 0.05 to 0.5 μm further improves a light heat conversion efficiency relative to the addition amount of the particles. The light heat conversion efficiency relative to the addition amount of the particles depends on a dispersity of the particles, and the well-dispersed particles have a high light heat conversion efficiency. Accordingly, these complex metal oxide particles are preferably dispersed according to a known dispersing method, separately to a dispersion liquid (paste), before being added to a coating liquid for the particle containing layer. The metal oxides having a primary average particle size of less than 0.01 μm are not preferred since they are difficult to disperse. A dispersant is optionally used for dispersion. The addition amount of the dispersant is preferably from 0.01 to 5% by weight, and more preferably from 0.1 to 2% by weight, based on the weight of the complex metal oxide particles.

These complex metal oxides have a color density in the visible wavelength regions and are preferably contained in the hydrophilic layer. In the invention, it is preferred in obtaining image visualization in the hydrophilic layer that the color density of the hydrophilic layer be lower. Accordingly, the complex metal oxide content of the hydrophilic layer is preferably not more than 20% by weight.

It is preferred in obtaining clear color contrast that the color density of the hydrophilic layer be lower, and therefore, infrared absorbing dye is preferably used as the light heat conversion material in the invention.

Examples of the infrared absorbing dye include a general infrared absorbing dye such as a cyanine dye, a chloconium dye, a polymethine dye, an azulenium dye, a squalenium dye, a thiopyrylium dye, a naphthoquinone dye or an anthraquinone dye, and an organometallic complex such as a phthalocyanine compound, a naphthalocyanine compound, an azo compound, a thioamide compound, a dithiol compound or an indoaniline compound. Exemplarily, the light-heat conversion materials include compounds disclosed in Japanese Patent O.P.I. Publication Nos. 63-139191, 64-33547, 1-160683, 1-280750, 1-293342, 2-2074, 3-26593, 3-30991, 3-34891, 3-36093, 3-36094, 3-36095, 3-42281, 3-97589 and 3-103476. These compounds may be used singly or in combination.

The infrared absorbing dye content of the hydrophilic layer is preferably from 0.1 to 10% by weight, and more preferably from 0.5 to 5% by weight, The light heat conversion material, which may be contained in the image formation layer, is preferably a material having low color density or a material providing an intended heat quantity in a small amount, for example, the infrared absorbing dye described above.

In the invention, in addition to the hydrophilic layer and the image formation layer, another layer can be provided on the substrate, and can contain the light heat conversion material. As another layer, there is, for example, an under layer, which may be provided between the substrate and the hydrophilic layer, or a protective layer, which may be provided on the image formation layer.

The image formation layer in the invention can contain a heat melting material having a melting point of 60 to 200° C.

The heat melting material is melted at image formation by applying heat to accelerate heat melting or mixing of the electron accepting developing agent and the electron providing dye precursor and functions as a sensitizer increasing color density of the formed image.

The heat melting material used in the invention is particularly a material having a low melt viscosity, or formed from materials generally classified into wax. The material preferably has a melting point of preferably from 60° C. to 150° C., and a melting point of more preferably from 60° C. to 120° C. The melting point less than 60° C. has a problem in storage stability and the melting point exceeding 200° C. lowers color formation sensitivity.

Materials usable include paraffin, polyolefin, polyethylene wax, microcrystalline wax, and fatty acid wax. The molecular weight thereof is approximately from 800 to 10,000. A polar group such as a hydroxyl group, an ester group, a carboxyl group, an aldehyde group and a peroxide group may be introduced into the wax by oxidation to increase the emulsification ability. Moreover, stearoamide, linolenamide, laurylamide, myristylamide, hardened cattle fatty acid amide, parmitylamide, oleylamide, rice bran oil fatty acid amide, palm oil fatty acid amide, a methylol compound of the above-mentioned amide compounds, methylenebissteastearoamide and ethylenebissteastearoamide may be added to the wax to lower the softening point or to raise the working efficiency. A cumarone-indene resin, a rosin-modified phenol resin, a terpene-modified phenol resin, a xylene resin, a ketone resin, an acryl resin, an ionomer and a copolymer of these resins may also be usable.

Sensitizers disclosed in Japanese Patent O.P.I. Publication Nos. 6-99663, and 7-52551 can be also used.

It is necessary that the heat melting material be a material having ink receptivity, or a material capable of exhibiting ink receptivity by heat application at image formation. The heat melting material is melted by heat application at image formation, and is fixed on the hydrophilic layer or permeates a porous hydrophilic layer described later to form image portions.

Among them, polyethylene, microcrystalline wax, fatty acid ester and fatty acid are preferably contained as materials having ink receptivity. A high sensitive image formation can be performed since these materials each have a relative low melting point and a low melt viscosity. which may be caused by scratch is further enhanced.

The heat melting material is preferably dispersed in the image formation layer in the form of particles. The average particle size of the heat melting material particles is preferably from 0.01 to 10 μm, and more preferably from 0.1 to 3 μm. When a layer containing the heat melting material particles is coated on the porous hydrophilic layer, the particles having an average particle size less than 0.01 μm may enter the pores of the hydrophilic layer or the valleys between the neighboring two peaks on the hydrophilic layer surface, resulting in insufficient on press development and background contaminations. The particles having an average particle size exceeding 10 μm may result in lowering of dissolving power. The composition of the heat melting material particles may be continuously varied from the interior to the surface of the particles. The particles may be covered with a different material. The heat melting material particle content of the image formation layer is preferably 1 to 80% by weight, more preferably 5 to 70% by weight, and still more preferably 10 to 60% by weight.

In the invention, the heat melting material is such that it does not exhibit ink receptivity alone, and when it is heat melted with the electron providing dye precursor or the electron accepting developing agent and mixed with them, it exhibits ink receptivity.

Such a heat melting material is any material as long as it has the function described above. With respect to ink receptivity, the heat melting material is not necessarily receptive to all kinds of printing inks, and may be receptive to a specific printing ink (for example, soybean oil ink or UV ink). Examples of the heat melting material having the above-described function include fatty acid amides such as stearic acid amide, linoleic acid amide, lauric acid amide, myristic acid amide, palmitic acid amide, and oleic acid amide.

Any heat melting material is preferably in the form of particles and is preferably used in the amount described above.

It is preferred that the image formation layer of the printing plate material of the invention can be removed on a printing press. As one example, such an image formation layer contains a water soluble material. The content of the water soluble material in the image formation layer is preferably from 0.1 to 90% by weight, and more preferably from 2 to 80% by weight.

When an image formation layer at unexposed portions is removed on a press, for example, with dampening water or ink, the water soluble material contained in the image formation layer improves removability of the layer. Examples of the water soluble material include oligosaccharides, polysaccharides (starches, celluloses, polyuronic acid, pullulan), polyethylene oxide, polypropylene oxide, polyvinyl alcohol, polyethylene glycol, polyvinyl ether, polyacrylamide and polyvinyl pyrrolidone.

Among those described above, the image formation layer in the invention preferably contains saccharides, and more preferably contains oligosaccharides. Since the oligosaccharides are easily dissolved in water, removal on a printing press of the image formation layer at non-image portions can be easily carried out. The removal does not require any other specific system, and printing can be carried out in the same manner as printing of a conventional PS plate, which does not increase loss of prints at the beginning of printing. Use of the oligosaccharide does not lower hydrophilicity of the hydrophilic layer and can maintain good printing performance of the hydrophilic layer. The oligosaccharide is a water-soluble crystalline substance generally having a sweet taste, which is formed by a dehydration condensation reaction of plural monosaccharide molecules. The oligosaccharide is one kind of o-glycoside having a saccharide as the aglycon. The oligosaccharide is easily hydrolyzed by an acid to form a monosaccharide, and is classified according to the number of monosaccharide molecules of the resulting hydrolysis compounds, for example, into disaccharide, trisaccharide, tetrasaccharide, and pentasscharide. The oligosaccharide referred to in the invention means di- to deca-saccharides. The oligosaccharide is classified into a reducing oligosaccharide and a non-reducing oligosaccharide according to presence or absence of a reducing group in the molecule. The oligosaccharide is also classified into a homo-oligosaccharide composed of the same kind of monosaccharide and a hetero-oligosaccharide composed of two or more kinds of monosaccharides. The oligosaccharide naturally exists in a free state or a glycoside state. Moreover, various oligosaccharides are formed by glycosyl transition by action of an enzyme. The oligosaccharide frequently exists in a hydrated state in an ordinary atmosphere. The melting points of the hydrated one and anhydrous one are different from each other as shown in the following Table 1.

TABLE 1

| Kinds of oligosaccharide | | Melting point (° C.) Hydrates | Anhydrides |
|---|---|---|---|
| Raffinose | Trisaccharide | 80 (Pentahydrate) | 118 |
| Trehalose | Disaccharide | 97 (Dihydrate) | 215 |
| Maltose | Disaccharide | 103 (Monohydrate) | 108 |
| Galactose | Disaccharide | 119 (Monohydrate) | 167 |
| Sucrose | Disaccharide | None | 182 |
| Lactose | Disaccharide | 201 (Monohydrate) | 252 |

In the invention, the image formation layer is preferably formed coating an aqueous coating solution containing the saccharide on a support. When an oligosscharide in the layer formed from the aqueous coating solution is one capable of forming a hydrate, the melting point of the oligosaccharide is that of its hydrate. Since the oligosaccharides, having a relatively low melting point, also melt within the temperature range at which heat melting materials having ink receptivity alone or an organic electron accepting developing agent melt, image formation is not inhibited which is carried out by movement on the hydrophilic layer surface or permeation into the porous hydrophilic layer described later of these melted materials and/or fusion adhesion of the heat fusible particles to the hydrophilic layer.

Among the oligosaccharides, trehalose with comparatively high purity is available on the market, and has an extremely low hygroscopicity, although it has high water solubility, providing excellent storage stability and excellent development property on a printing press. When oligosaccharide hydrates are heat melted to remove the hydrate water and solidified, the oligosaccharide is in a form of anhydride for a short period after solidification. Trehalose is characterized in that a melting point of trehalose anhydride is not less than 100° C. higher that that of trehalose hydrate. This characteristics provides a high melting point and reduced heat fusibility at exposed portions of the trehalose-containing layer immediately after heat-fused by infrared ray exposure and re-solidified, preventing image defects at exposure such as banding from occurring. In order to attain the object of the invention, trehalose is preferable among oligosaccharides. The oligosaccharide content of the layer is preferably from 0.1 to 90% by weight, and more preferably from 2 to 80% by weight, based on the total weight of the layer.

The image formation layer may optionally contain a surfactant or an anti-foaming agent.

The hydrophilic layer used in the printing plate material of the invention refers to a layer having a function in which when a dampening water or printing ink is supplied to the layer under general conditions on a printing press, the layer regions, where images are not recorded, receive the dampening water to form non-image portions.

As the hydrophilic layer in the invention containing no electron providing dye precursor, the hydrophilic layer disclosed in Japanese Patent O.P.I. Publication Nos. 9-123387 and 7-301911 can be used, but the hydrophilic layer in the invention is preferably a porous hydrophilic layer described later.

Material for forming a hydrophilic layer in the hydrophilic layer is preferably a metal oxide. The metal oxide preferably comprises metal oxide particles. Examples of the metal oxide particles include a colloidal silica, an alumina sol, a titania sol and another metal oxide sol. The metal oxide particles may have any shape such as spherical, needle-like, and feather-like shape. The average particle size is preferably from 3 to 100 nm, and plural kinds of metal oxide each having a different size may be used in combination. The surface of the particles may be subjected to surface treatment. The metal oxide particles can be used as a binder, utilizing its layer forming ability. The metal oxide particles are suitably used in a hydrophilic layer since they minimize lowering of the hydrophilicity of the layer as compared with an organic compound binder. The metal oxide content of the hydrophilic layer is preferably from 10 to 100% by weight, and more preferably from 50 to 99% by weight based on the weight of the hydrophilic layer.

Among the above-mentioned, colloidal silica is particularly preferred. The colloidal silica has a high layer forming ability under a drying condition with a relative low temperature, and can provide a good layer strength. It is preferred that the colloidal silica described above is necklace-shaped colloidal silica or colloidal silica particles having an average particle size of not more than 20 nm, each being described later. Further, it is preferred that the colloidal silica provides an alkaline colloidal silica solution as a colloid solution.

The necklace-shaped colloidal silica is a generic term of an aqueous dispersion system of a spherical silica having a primary particle size of the order of nm, and means a "pearl necklace-shaped" colloidal silica formed by connecting spherical colloidal silica particles each having a primary particle size of from 10 to 50 μm so as to attain a length of from 50 to 400 nm. The term of "pearl necklace-shaped" means that the image of connected colloidal silica particles is like to the shape of a pearl necklace. The bonding between the silica particles forming the necklace-shaped colloidal silica is considered to be —Si—O—Si—, which is formed by dehydration of —SiOH groups located on the surface of the silica particles. Concrete examples of the necklace-shaped colloidal silica include Snowtex-PS series produced by Nissan Kagaku Kogyo, Co., Ltd. As the products, there are Snowtex-PS-S (the average particle size in the connected state is approximately 110 nm), Snowtex-PS-M (the average particle size in the connected state is approximately 120 nm) and Snowtex-PS-L (the average particle size in the connected state is approximately 170 nm). Acidic colloidal silicas corresponding to each of the above-mentioned are Snowtex-PS-S-O, Snowtex-PS-M-O and Snowtex-PS-L-O, respectively. Addition of the necklace-shaped colloidal silica makes it possible to form small pores with a several nm order, and to secure porosity and strength of the layer, and the necklace-shaped colloidal silica is preferably used in the hydrophilic layer as a porosity providing material. Among them, the use of Snowtex-PS-S, Snowtex-PS-M or Snowtex-PS-L, each being alkaline colloidal silica particles, is particularly preferable since the strength of the hydrophilic layer is increased and occurrence of background contamination is inhibited even when a lot of prints are printed.

It is known that the binding force of the colloidal silica particles is become larger with decrease of the particle size. The average particle size of the colloidal silica particles to be used in the invention is preferably not more than 20 nm, and more preferably 3 to 15 nm. As above-mentioned, the alkaline colloidal silica particles show the effect of inhibiting occurrence of the background contamination. Accordingly, the use of the alkaline colloidal silica particles is particularly preferable.

Examples of the alkaline colloidal silica particles having the average particle size within the foregoing range include Snowtex-20 (average particle size: 10 to 20 nm), Snowtex-30 (average particle size: 10 to 20 nm), Snowtex-40 (average particle size: 10 to 20 nm), Snowtex-N (average particle size: 10 to 20 nm), Snowtex-S (average particle size: 8 to 11 nm) and Snowtex-XS (average particle size: 4 to 6 nm), each produced by Nissan Kagaku Co., Ltd. The colloidal silica particles having an average particle size of not more than 20 nm, when used together with the necklace-shaped colloidal silica as described above, is particularly preferred, since porosity of the layer is maintained and the layer strength is further increased. The ratio of the colloidal silica particles having an average particle size of not more than 20 nm to the necklace-shaped colloidal silica is preferably from 95/5 to 5/95, more preferably from 70/30 to 20/80, and most preferably from 60/40 to 30/70.

The hydrophilic layer of the printing plate precursor of the invention contains porous metal oxide particles as metal oxides. Examples of the porous metal oxide particles include porous silica particles, porous aluminosilicate particles or zeolite particles as described later.

The porous silica particles are ordinarily produced by a wet method or a dry method. By the wet method, the porous silica particles can be obtained by drying and pulverizing a gel prepared by neutralizing an aqueous silicate solution, or pulverizing the precipitate formed by neutralization. By the dry method, the porous silica particles are prepared by combustion of silicon tetrachloride together with hydrogen and oxygen to precipitate silica. The porosity and the particle size of such particles can be controlled by variation of the production conditions.

The porous silica particles prepared from the gel by the wet method is particularly preferred. The porous aluminosilicate particles can be prepared by the method described in, for example, JP O.P.I. No. 10-71764. Thus prepared aluminosilicate particles are amorphous complex particles synthesized by hydrolysis of aluminum alkoxide and silicon alkoxide as the major components. The particles can be synthesized so that the ratio of alumina to silica in the particles is within the range of from 1:4 to 4:1. Complex particles composed of three or more components prepared by an addition of another metal alkoxide may also be used in the invention. In such a particle, the porosity and the particle size can be controlled by adjustment of the production conditions.

The porosity of the particles is preferably not less than 1.0 ml/g, more preferably not less than 1.2 ml/g, and most preferably of from 1.8 to 2.5 ml/g, in terms of pore volume before the dispersion. The pore volume is closely related to water retention of the coated layer. As the pore volume increases, the water retention is increased, contamination is difficult to occur, and the water retention latitude is broad. Particles having a pore volume of more than 2.5 ml/g are brittle, resulting in lowering of durability of the layer containing them. Particles having a pore volume of less than 0.5 ml/g may be insufficient in printing performance.

<Zeolite Particles>

Zeolite is a crystalline aluminosilicate, which is a porous material having voids of a regular three dimensional net work structure and having a pore size of 0.3 to 1 nm.

The natural and synthetic zeolites are expressed by the following formula.

$$(M_1 \cdot (M_2)_{1/2})_m(Al_mSi_nO_{2(m+n)}) \cdot xH_2O$$

In the above, $M_1$ and $M_2$ are each exchangeable cations. Examples of $M_1$ include $Li^+$, $Na^+$, $K^+$, $Tl^+$, $Me_4N^+$ (TMA), $Et_4N^+$(TEA), $Pr_4N^+$(TPA), $C_7H_{15}N^{2+}$, and $C_8H_{16}N^+$, and examples of $M^2$ include $Ca^{2+}$, $Mg^{2+}$, $Ba^{2+}$, $Sr^{2+}$ and $C_8H_{18}N_2^{2+}$. Relation of n and m is $n \geqq m$, and consequently, the ratio of m/n, or that of Al/Si is not more than 1. A higher Al/Si ratio shows a higher content of the acid center, and a higher polarity, resulting in higher hydrophilicity. The Al/Si ratio is within the range of preferably from 0.4 to 1.0, and more preferably 0.8 to 1.0. x is an integer.

Synthetic zeolite having a stable Al/Si ratio and a sharp particle size distribution is preferably used as the zeolite particles to be used in the invention. Examples of such zeolite include Zeolite A: $Na_{12}(Al_{12}Si_{12}O_{48}).27H_2O$; Al/Si=1.0, Zeolite X: $Na_{86}(Al_{86}Si_{106}O_{384}).264H_2O$; Al/Si=0.811, and Zeolite Y: $Na_{56}(Al_{56}Si_{136}O_{384}).250H_2O$; Al/Si=0.412. Containing the porous zeolite particles having an Al/Si ratio within the range of from 0.4 to 1.0 in the hydrophilic layer greatly raises the hydrophilicity of the hydrophilic layer itself, whereby contamination in the course of printing is inhibited and the water retention latitude is also increased. Further, contamination caused by a finger mark is also greatly reduced. When Al/Si is less than 0.4, the hydrophilicity is insufficient and the above-mentioned improving effects are lowered.

The hydrophilic layer of the printing plate precursor of the invention can contain layer structural clay mineral particles as a metal oxide. Examples of the layer structural clay mineral particles include a clay mineral such as kaolinite, halloysite, talk, smectite such as montmorillonite, beidellite, hectorite and saponite, vermiculite, mica and chlorite; hydrotalcite; and a layer structural polysilicate such as kanemite, makatite, ilerite, magadiite and kenyte. Among them, ones having a higher electric charge density of the unit layer are higher in the polarity and in the hydrophilicity. Preferable charge density is not less than 0.25, more preferably not less than 0.6. Examples of the layer structural mineral particles having such a charge density include smectite having a negative charge density of from 0.25 to 0.6 and bermiculite having a negative charge density of from 0.6 to 0.9. Synthesized fluorinated mica is preferable since one having a stable quality, such as the particle size, is available. Among the synthesized fluorinated mica, swellable one is preferable and one freely swellable is more preferable.

An intercalation compound of the foregoing layer structural mineral particles such as a pillared crystal, or one treated by an ion exchange treatment or a surface treatment such as a silane coupling treatment or a complication treatment with an organic binder is also usable.

With respect to the size of the planar structural mineral particles, the particles have an average particle size (an average of the largest particle length) of preferably not more than 20 μm, and more preferably not more than 10 μm, and an average aspect ratio (the largest particle length/the particle thickness of preferably not less than 20, and more preferably not less than 50, in a state contained in the layer including the case that the particles are subjected to a swelling process and a dispersing layer-separation process. When the particle size is within the foregoing range, continuity to the parallel direction, which is a trait of the layer structural particle, and softness, are given to the coated layer so that a strong dry layer in which a crack is difficult to be formed can be obtained. The coating solution containing the layer structural clay mineral particles in a large amount can minimize particle sedimentation due to a viscosity increasing effect. The particle size greater than the foregoing may produce a non-uniform coated layer, resulting in poor layer strength. The aspect ratio lower than the foregoing reduces the planar particles, resulting in insufficient viscosity increase and reduction of particle sedimentation inhibiting effect.

The content of the layer structural clay mineral particles is preferably from 0.1 to 30% by weight, and more preferably from 1 to 10% by weight based on the total weight of the layer. Particularly, the addition of the swellable synthesized fluorinated mica or smectite is effective if the adding amount is small. The layer structural clay mineral particles may be added in the form of powder to a coating liquid, but it is preferred that gel of the particles which is obtained by being swelled in water, is added to the coating liquid in order to obtain a good dispersity according to an easy coating liquid preparation method which requires no dispersion process comprising dispersion due to media.

An aqueous solution of a silicate is also usable as another additive to the hydrophilic layer in the invention. An alkali metal silicate such as sodium silicate, potassium silicate or lithium silicate is preferable, and the $SiO_2/M_2O$ is preferably selected so that the pH value of the coating liquid after addition of the silicate exceeds 13 in order to prevent dissolution of the porous metal oxide particles or the colloidal silica particles.

An inorganic polymer or an inorganic-organic hybrid polymer prepared by a sol-gel method employing a metal alkoxide. Known methods described in S. Sakka "Application of Sol-Gel Method" or in the publications cited in the above publication can be applied to prepare the inorganic polymer or the inorganic-organic hybridpolymer by the sol-gel method.

In the invention, a water soluble resin may be contained. Examples of the water soluble resin include polysaccharides, polyethylene oxide, polypropylene oxide, polyvinyl alcohol, polyethylene glycol (PEG), polyvinyl ether, a styrene-butadiene copolymer, a conjugation diene polymer latex of methyl methacrylate-butadiene copolymer, an acryl polymer latex, a vinyl polymer latex, polyacrylamide, and polyvinyl pyrrolidone. In the invention, polysaccharides are preferably used as the water soluble resin.

As the polysaccharide, starches, celluloses, polyuronic acid and pullulan can be used. Among them, a cellulose derivative such as a methyl cellulose salt, a carboxymethyl cellulose salt or a hydroxyethyl cellulose salt is preferable, and a sodium or ammonium salt of carboxymethyl cellulose is more preferable. These polysaccharides can form a preferred surface shape of the hydrophilic layer.

The surface of the hydrophilic layer preferably has a convexoconcave structure having a pitch of from 0.1 to 50 μm such as the grained aluminum surface of an aluminum PS plate. The water retention ability and the image maintaining ability are raised by such a convexoconcave structure of the surface. Such a convexoconcave structure can also be formed by adding in an appropriate amount a filler having a suitable particle size to the coating liquid of the hydrophilic layer. However, the convexoconcave structure is preferably formed by coating a coating liquid for the hydrophilic layer containing the alkaline colloidal silica and the water-soluble polysaccharide so that the phase separation occurs at the time of drying the coated liquid, whereby a structure is obtained which provides a good printing performance. The shape of the convexoconcave structure such as the pitch and the surface roughness thereof can be suitably controlled by the kinds and the adding amount of the alkaline colloidal silica particles, the kinds and the adding amount of the water-soluble polysaccharide, the kinds and the adding amount of another additive, a solid concentration of the coating liquid, a wet layer thickness or a drying condition.

In the invention, it is preferred that the water soluble resin contained in the hydrophilic layer is water soluble, and at least a part of the resin exists in the hydrophilic layer in a state capable of being dissolved in water. If a water soluble carbon atom-containing material is cross-linked by a crosslinking agent and is insoluble in water, its hydrophilicity is lowered, resulting in problem of lowering printing performance. A cationic resin may also be contained in the hydrophilic layer. Examples of the cationic resin include a polyalkylene-polyamine such as a polyethyleneamine or polypropylenepolyamine or its derivative, an acryl resin having a tertiary amino group or a quaternary ammonium group and diacrylamine. The cationic resin may be added in a form of fine particles. Examples of such particles include the cationic microgel described in Japanese Patent O.P.I. Publication No. 6-161101.

A water-soluble surfactant may be added for improving the coating ability of the coating liquid for the hydrophilic layer in the invention. A silicon atom-containing surfactant and a fluorine atom-containing surfactant are preferably used. The silicon atom-containing surfactant is especially preferred in that it minimizes printing contamination. The content of the surfactant is preferably from 0.01 to 3% by weight, and more preferably from 0.03 to 1% by weight based on the total weight of the hydrophilic layer (or the solid content of the coating liquid).

The hydrophilic layer in the invention can contain a phosphate. Since a coating liquid for the hydrophilic layer is preferably alkaline, the phosphate to be added to the hydrophilic layer is preferably sodium phosphate or sodium monohydrogen phosphate. The addition of the phosphate provides improved reproduction of dots at shadow portions. The content of the phosphate is preferably from 0.1 to 5% by weight, and more preferably from 0.5 to 2% by weight in terms of amount excluding hydrated water.

The hydrophilic layer in the invention can contain a light heat conversion material as described later. When the material is in the particle form, the particle size is preferably less than 1 μm.

The hydrophilic layer can contain inorganic particles having a particle size not less than 1 μm or particles covered with inorganic material, in order to suitably control the surface shape of the hydrophilic layer.

Examples of the inorganic particles include well-known metal oxide particles include particles of silica, alumina, titania and zirconia. Porous metal oxide particles are preferably used in order to prevent sedimentation of the particles in a coating liquid. As the porous metal oxide particles, the porous silica particles and the porous aluminosilicate particles described above are preferably used. The particle size of the inorganic particles is preferably from 1/10 to 1/100 of that of the core particles.

The inorganic material coated particles include particles in which organic particles such as PPMA particles or polystyrene particles form cores and the cores are covered with inorganic particles having a size smaller than that of the cores. There are various covering methods, but a dry covering method is preferred in which the cores collide with the covering materials at high speed in air as in a hybridizer for the covering materials to penetrate the surface of the cores and fix them there.

Particles in which organic particles are plated with a metal can be used. Examples of such particles include Micropearl AU produced by Sekisui Kagaku Co., Ltd., in which resin particles are plated with a metal.

The particle size is more preferably from 1 to 10 μm, still more preferably from 1.5 to 8 μm, and most preferably from 2 to 6 μm. When the particle size exceeds 10 μm, it may lower dissolution of formed images or result in contamination of blanket during printing. In the invention, the content of the particles having a particle size of not less than 1 μm in the hydrophilic layer is suitably adjusted to satisfy the parameters regarding the invention, but is preferably from 1 to 50% by weight, and more preferably from 5 to 40% by weight, based on the hydrophilic layer.

The content in the hydrophilic layer of carbon atom-containing materials such as organic resins or carbon black, which are other than the electron providing dye precursor, is preferably lower in increasing hydrophilicity of the hydrophilic layer. The total content of these materials in the hydrophilic layer is preferably less than 9% by weight, and more preferably less than 5% by weight.

The hydrophilic layer may form a two-layered structure in which one under layer is provided under the hydrophilic layer or a multi-layered structure in which two or more under layers are provided under the hydrophilic layer. In the invention, when the under layer is provided, materials used in the under layer include the same materials as in the hydrophilic layer described previously.

The under layer, which is porous, is less advantageous. The under layer is preferably non-porous. The porosity providing agent content of the under layer is preferably lower than that of the hydrophilic layer in view of strength of the under layer. It is more preferable that the under layer contains no porosity providing agent. The under layer can also contain particles covered with inorganic particles or inorganic materials each having a particle size not less than 1 μm, in order to suitably control the surface shape of the hydrophilic layer. The content of the particles having a particle size of not less than 1 μm in the under layer is preferably from 1 to 50% by weight, and more preferably from 5 to 40% by weight, based on the under layer.

Like the hydrophilic layer, the content of carbon atom-containing materials such as the organic resins or carbon black in the under layer is preferably lower in increasing hydrophilicity of the under layer. The total content of these materials in the under layer is preferably less than 9% by weight, and more preferably less than 5% by weight.

Another embodiment of the invention is a printing plate material comprising a substrate and provided thereon, a component layer comprising a hydrophilic layer and an image formation layer, the hydrophilic layer being provided closer to the substrate than the image formation layer, wherein the component layer contains a light heat conversion material, a fatty acid amide, and a substance, which when it is heat melted and mixed with the fatty acid amide, exhibits ink receptivity. The substance, which when it is heat melted and mixed with the fatty acid amide, exhibits ink receptivity, is preferably the electron providing dye precursor or the organic electron accepting developing agent, described above.

This embodiment relates to a printing plate material suitably used in, for example, a DI printing press which requires no exposure image visualization. A printing plate material comprising a hydrophilic layer containing an electron providing dye precursor and an image formation layer containing a fatty acid amide but no organic electron accepting developing agent does not provide exposure image visualization but forms an image formation layer with ink receptivity, provides good initial printability and high scratch resistance.

Still another embodiment, a printing plate material comprising a hydrophilic layer containing an electron providing dye precursor and a fatty acid amide each being in the form of particles can also provide the same performance as described above.

The image formation method of the invention comprises the steps of exposing a printing plate material employing an infrared laser; the printing plate material comprising a substrate and provided thereon, a component layer comprising a hydrophilic layer and an image formation layer, the hydrophilic layer being provided closer to the substrate than the image formation layer, wherein the hydrophilic layer contains an electron providing dye precursor, the image formation layer contains an organic electron accepting developing agent, and the component layer contains a light heat conversion material; melting the electron accepting developing agent at exposed portions so that the melted agent permeates the hydrophilic layer to form a color image in the hydrophilic layer; and then removing a part of the image formation layer (preferably an image formation layer at unexposed portions).

In the printing plate material described above, the electron providing dye precursor is contained in the hydrophilic layer and the organic electron accepting developing agent contained in the image formation layer provided on the hydrophilic layer. Accordingly, the printing plate material in which the electron providing dye precursor and the electron accepting developing agent are contained in a different layer, and the image formation method described above is one in which good storage stability can be obtained.

The printing plate material above has a structure in which the hydrophilic layer is a layer to be colored and the image formation layer works as a protective layer, and accordingly, there is no problem in the image formation method of the invention that an exposure device is contaminated by the coloring matters, since when the printing plate material is exposed through an infrared laser, coloring matters do not scatter nor sublime from the plate surface.

One embodiment of the image formation method of the invention comprises the step removing a part of the image formation layer (preferably an image formation layer at unexposed portions) on a printing press. In this method, even when the image formation layer to be removed on a printing press contains a light heat conversion material such as an infrared absorbing dye, the color density is only slight. Accordingly, this method is also an image formation method in which there is no problem that a printing press is contaminated by such an infrared absorbing dye.

Another embodiment of the image formation method of the invention comprises the step of exposing a printing plate material on a printing press employing an infrared laser installed in the printing press.

EXAMPLES

The present invention will be explained below employing examples, but is not limited thereto.

(Substrate 1)

A subbing layer was coated on one side of a 175 nm thick PET film according to the following procedures to obtain substrate 1.

<<First Subbing Layer>>

The surface of the PET film was corona discharged, and the following coating solution was coated onto the discharged surface by a wire bar at 20° C. and 55% RH to obtain a first subbing layer with a dry thickness of 0.4 μm, and dried at 140° C. for 2 minutes.

<Composition of First Subbing Layer Coating Solution>

| | |
|---|---|
| Acryl latex particles (n-butyl acrylate/t-butyl acrylate/styrene/hydroxyethyl methacrylate (=28/22/25/25) copolymer) | 36.9 g |
| Surfactant (A) | 0.36 g |
| Hardener (a) | 0.98 g |

Distilled water was added to the above composition to make 1,000 ml to obtain a first subbing layer coating solution.

<<Second Subbing Layer>>

The surface of the first subbing layer was corona discharged, and the following coating solution was coated onto the discharged surface by an air knife method at 35° C. and 22% RH to obtain a second subbing layer with a dry thickness of 0.1 μm, and dried at 140° C. for 2 minutes. (Thus, a support was obtained.)

<Composition of Second Subbing Layer Coating Solution>

| | |
|---|---|
| Gelatin | 9.6 g |
| Surfactant (A) | 0.4 g |
| Hardener (b) | 0.1 g |

Distilled water was added to the above composition to make 1,000 ml to obtain a second subbing layer coating solution.

Surfactant (A)

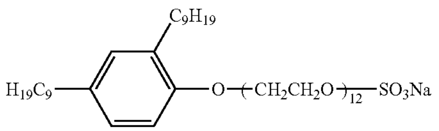

Hardener (a)

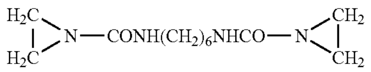

Hardener (b)

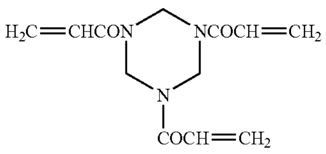

(Substrate 2)

A 0.24 mm thick aluminum plate (1050, H16) was immersed in an aqueous 1% by weight sodium hydroxide solution at 50° C. to give an aluminum dissolution amount of 2 $g/m^2$, washed with pure water, immersed in an aqueous 0.1% by weight hydrochloric acid solution at 25° C. for 30 seconds to neutralize, and then washed with water.

Subsequently, the aluminum plate was subjected to an electrolytic surface-roughening treatment in an electrolytic solution containing 10 g/liter of hydrochloric acid and 0.5 g/liter of aluminum at a peak current density of 50 A/$dm^2$ employing an alternating current with a sine waveform, in which the distance between the plate surface and the electrode was 10 mm. The electrolytic surface-roughening treatment was divided into 12 treatments, in which the quantity of electricity used in one time treatment (at a positive polarity) was 40 C/$dm^2$, and the total quantity of electricity used (at a positive polarity) was 480 C/$dm^2$. Standby time of 5 seconds, during which no surface-roughening treatment was carried out, was provided after each of the separate electrolytic surface-roughening treatments.

Subsequently, the resulting aluminum plate was immersed in an aqueous 1% by weight sodium hydroxide solution at 50° C. and etched to give an aluminum dissolution amount (including smut produced on the surface) of 2 g/$m^2$, washed with water, neutralized in an aqueous 10% by weight sulfuric acid solution at 25° C. for 10 seconds, and washed with water. Subsequently, the aluminum plate was subjected to anodizing treatment in an aqueous 20% by weight sulfuric acid solution at a constant voltage of 20 V, in which a quantity of electricity of 150 C/$dm^2$ was supplied, and washed with water.

The washed surface of the plate was squeegeed, and the plate was immersed in an aqueous 1% by weight sodium silicate (No. 3) at 70° C. for 30 seconds, washed with water, and dried at 80° C. for 5 minutes. Thus, substrate 2 was obtained. The Ra of the substrate 2 was 450 nm. (The Ra was measured at a magnifying power of 40 employing RSP Plus produced by WYKO Co., Ltd.)

(Substrate 3)

The substrate 3 was prepared in the same manner as in substrate 2, except that the electrolytic surface-roughening treatment was carried out at 80 A/$dm^2$, and one time electrolytic surface-roughening treatment was carried out at a quantity of electricity of 150 C/$dm^2$. The Ra of the substrate 3 was 600 nm.

(Preparation of an Aqueous Electron Providing Dye Precursor Particle Dispersion)

<<Aqueous Electron Providing Dye Precursor Particle Dispersion 1>>

Electron providing dye precursor ODB-2 (produced by Yamamoto Kasei Co., Ltd.) of 18 g, 50 g of an aqueous 4% by weight carboxymethylcellulose (CMC 1220, produced by Daicel Chemical Co., Ltd.) solution and 32 g of pure water were mixed and dispersed in a sand grinder for 3 hours. Zirconia beads were used as a dispersant, and the dispersion rotation number was 2000 rpm. Pure water of 100 g were added to the mixture for dilution, and mixed for 10 minutes at 500 rpm. Thereafter, the beads were removed to obtain an aqueous electron providing dye precursor particle dispersion 1 having a solid content of 10% by weight. The average particle size of the electron providing dye precursor particles was about 1 μm.

Preparation of an Aqueous Electron Accepting Developing Agent Particle Dispersion)

<<Aqueous Electron Accepting Developing Agent Particle Dispersion 1>>

Aqueous electron accepting developing agent particle dispersion 1 was prepared in the same manner as in aqueous electron providing dye precursor particle dispersion 1, except that a bisphenol S derivative, 4-hydroxy-4'-isopropoxydiphenyl methane (produced by Nippon Soda Co., Ltd.) was used instead of ODB-2. The average particle size of the electron accepting developing agent particles was about 1 μm.

<<Aqueous Electron Accepting Developing Agent Particle Dispersion 2>>

Aqueous electron accepting developing agent particle dispersion 2 was prepared in the same manner as in aqueous electron accepting developing agent particle dispersion 1, except that 2,4'-dihydroxydiphenyl sulfone (produced by Konishi Co., Ltd.) was used instead of 4-hydroxy-4'-isopropoxydiphenyl methane. The average particle size of the electron accepting developing agent particles was about 1 μm.

(Preparation of Hydrophilic Layer Coating Solution)

<<Preparation of Hydrophilic Layer Coating Solutions 1 and 2>>

Materials as shown in Table 2 were sufficiently mixed in a homogenizer while stirring, and filtered to obtain coating solutions of hydrophilic layers 1 through 4. The numerical values in Table 2 represent parts by weight, unless otherwise specified.

TABLE 2

| Materials used | Hydrophilic layer coating solution 1 | Hydrophilic layer coating solution 2 | Hydrophilic layer coating solution 3 | Hydrophilic layer coating solution 4 |
|---|---|---|---|---|
| *1 | 12.80 | 10.38 | 8.18 | 12.86 |
| *2 | 28.80 | 28.91 | 28.61 | 35.83 |
| *3 | 0.45 | 0.45 | 0.45 | 0.45 |
| *4 | 6.00 | 6.00 | 6.00 | 6.00 |
| *5 | 1.88 | 0.75 | 0.00 | 3.75 |
| *6 | 0.75 | 0.75 | 0.75 | 0.75 |
| *7 | 1.50 | 1.50 | 1.50 | 1.50 |
| *8 | 1.50 | 1.50 | 1.50 | 1.50 |
| *9 | 15.00 | 22.50 | 30.00 | 0.00 |
| Pure water | 31.33 | 27.26 | 23.01 | 37.36 |
| Solid content (weight %) | 15.00 | 15.00 | 15.00 | 15.00 |

*1: Colloidal silica (alkali type) Snowtex S (solid 30% by weight, produced by Nissan Kagaku Co., Ltd.)
*2: Necklace shaped colloidal silica (alkali type) Snowtex PSM (solid 20% by weight, produced by Nissan Kagaku Co., Ltd.)
*3: Infrared absorbing dye ADS830WS produced by American Dye Source Co., Ltd.
*4: Layer structural clay mineral particles: Montmorillonite Mineral Colloid MO gel prepared by vigorously stirring montmorillonite Mineral Colloid MO; gel produced by Southern Clay Products Co., Ltd. (average particle size: 0.1 μm) in water in a homogenizer to give a solid content of 5% by weight
*5: Aqueous 4% by weight sodium carboxymethylcellulose solution of sodium carboxymethylcellulose CMC1220 (produced by Daicel Chemical Co., Ltd.)
*6: Aqueous 10% by weight sodium phosphate · dodecahydrate solution (Reagent produced by Kanto Kagaku Co., Ltd.)
*7: Porous metal oxide particles Silton AMT 08 (porous aluminosilicate particles having an average particle size of 0.6 μm, produced by Mizusawa Kagaku Co., Ltd.)
*8: Porous metal oxide particles Silton JC 30 (porous aluminosilicate particles having an average particle size of 3 μm, produced by Mizusawa Kagaku Co., Ltd.)
*9: Aqueous electron providing dye precursor particle dispersion 1 (having a solid content of 10% by weight)

<<Preparation of Image Formation Layer Coating Solution>>

The materials as shown in Table 3 were sufficiently mixed while stirring, and filtered to obtain image formation layer coating solutions 1 through 6. The numerical values in Table 3 represent parts by weight, unless otherwise specified.

TABLE 3

| Materials used | Image formation layer coating solution 1 | Image formation layer coating solution 2 | Image formation layer coating solution 3 | Image formation layer coating solution 4 | Image formation layer coating solution 5 | Image formation layer coating solution 6 |
|---|---|---|---|---|---|---|
| **1 | 0.00 | 0.00 | 0.00 | 0.00 | 20.00 | 0.00 |
| **2 | 35.00 | 0.00 | 35.00 | 0.00 | 30.00 | 0.00 |
| **3 | 0.00 | 30.00 | 0.00 | 0.00 | 0.00 | 0.00 |
| **4 | 59.00 | 0.00 | 0.00 | 0.00 | 44.00 | 80.00 |
| **5 | 0.00 | 60.00 | 59.00 | 80.00 | 0.00 | 0.00 |
| **6 | 5.00 | 9.00 | 5.00 | 19.00 | 5.00 | 19.00 |
| **7 | 0.10 | 0.10 | 0.10 | 0.10 | 0.10 | 0.10 |
| Pure water | 0.90 | 0.90 | 0.90 | 0.90 | 0.90 | 0.90 |
| Solid content (weight %) | 10.0 | 10.0 | 10.0 | 10.0 | 10.0 | 10.0 |

**1: Aqueous electron providing dye precursor particle dispersion 1 (having a solid content of 10% by weight)
**2: Aqueous electron accepting developing agent particle dispersion 1 (having a solid content of 10% by weight)
**3: Aqueous electron accepting developing agent particle dispersion 2 (having a solid content of 10% by weight)
**4: Heat melting material, Emulsion obtained by diluting Carnauba wax emulsion A118 (having a solid content of 40% by weight, the wax having an average particle size of 0.3 μm, a melting viscosity at 140° C. of 8 cps, a softening point of 65° C., and a melting point of 80° C., produced by GifuCerac Co., Ltd.) with water to a solid content of 10%
**5: Heat melting material, Emulsion obtained by diluting atearic acid amide emulsion L271 (having a solid content of 24.8% by weight, produced by Chukyo Yushi Co., Ltd.) with water to a solid content of 10%
**6: Water soluble material, Aqueous solution of disaccharide trehalose powder (Treha, mp. 97° C., produced by Hayashihara Shoji Co., Ltd.) having a solid content of 10% by weight
**7: Infrared absorbing dye CV-17 (produced by Nippon Kayaku Co., Ltd.)

Example 1

(Preparation of Printing Plate Material)

The above-obtained coating solution was coated on the substrate obtained above employing a wire bar to obtain a combination as shown in Table 4, and dried to give an image formation layer having a dry thickness as shown in Table 4. Thus, inventive and comparative printing plate material samples were prepared.

The coated hydrophilic layer was dried at 80° C. for 3 minutes, and then further aged at 60° C. for 24 hours. The coated image formation layer was dried at 55° C. for 3 minutes, and then further aged at 55° C. for 24 hours.

(Image Formation)

Image formation was carried out by infrared laser exposure. Exposure was carried out employing an infrared laser (having a wavelength of 830 nm and a beam spot diameter of 18 μm) at an exposure energy of 300 mJ/cm$^2$, at a resolution of 2400 dpi and at a screen line number of 175 to form an image, the beam being focused on the surface of the image formation layer. The term, “dpi” shows the number of dots per 2.54 cm. A solid image and an image with a dot area of from 1 to 99% were employed as an image for evaluation.

(Evaluation of Exposure Image Visualization)

Reflection density of the exposed printing plate material sample was measured at both unexposed portions and exposed portions (solid image portions) at a mode K employing Macbeth RD 918, and Δd was determined wherein Ad represents (reflection density at exposed portions—reflection density at unexposed portions). Exposure image visualization was evaluated according to the following criteria. The results are shown in Table 4.

A: Δd is 0.4 or more.

B: Δd is from 0.25 to less than 0.4.

A: Δd is from 0.12 to less than 0.25.

A: Δd is less than 0.12.

(Evaluation of Exposure Device Contamination)

The surface of the printing plate material sample was covered with a 12 μm thick PET film, and imagewise exposure was carried out in the same manner as above. The PET film was removed from the exposed sample, and deposits of the film were observed. Exposure device contamination was evaluated according to the following criteria. The results are shown in Table 4.

A: No deposits were observed.

B: A few white deposits were observed.

C: White deposits were observed.

D: Colored deposits were observed.

(Evaluation of Colored Material Wiped off with Water)

The surface of the exposed printing plate material sample was wiped with absorbent cotton impregnated with a dampening water to be used in printing, and colored material deposited to the cotton were observed. The colored material deposition degree was evaluated according to the following criteria. The results are shown in Table 4.

A: No colored material was observed.

B: Slight colored material derived from the IR dye was observed.

C: Colored material derived from the IR dye was observed.

D: Colored material, which was a dye derived from the dye precursor, was observed.

(Printing Method)

The exposed printing plate precursor sample was mounted on a printing press, DAIYA 1F-1 produced by Mitsubishi Jukogyo Co., Ltd. Printing was carried out employing a coated paper, dampening water, a 2% by weight solution of Astromark 3 (produced by Nikken Kagaku Kenkyusyo Co., Ltd.), and printing ink (Toyo King Hyecho M Magenta, produced by Toyo Ink Manufacturing Co.). Printing was carried out in the same manner as sequence carried out in the conventional PS plate, provided that a special development was not carried out on the printing press.

(Evaluation of Initial Printability)

The number of paper sheets printed from when printing started to when print with a good S/N ratio was obtained was counted and evaluated as a measure of initial printability. Herein, “print with a good S/N ratio” refers to print in which no stain was observed at the non-image portions, the dotted images were reproduced, and density at the solid images fell within a proper range. Initial printability was evaluated according to the following criteria. The results are shown in Table 4.

A: The number was less than 10.
B: The number was from 10 to less than 20.
C: The number was from 20 to less than 40.
D: The number was not less than 40.

Evaluation of Resistance to Stain Due to Scratch (Also Referred to Scratch Resistance)

The surface at unexposed portions of the imagewise exposed printing plate material sample obtained above was scratched with a needle to which loads varied were applied, employing HEIDON Tester. Employing the resulting printing plate material sample, 100 sheets of paper were printed in the same manner as above, and the fiftieth printed sheet of paper was observed. The maximum load at which staining due to scratching was not observed on the printed paper sheet was regarded as a measure of scratch resistance. As the needle, a sapphire needle having a tip diameter of 0.3 mm was used. Scratch resistance was evaluated according to the following criteria. The results are shown in Table 4.

A: The maximum load was 150 g or more.
B: The maximum load was from 100 g to less than 150 g.
C: The maximum load was from 50 g to less than 100 g.
D: The maximum load was less than 50 g.

As is apparent from Table 4 above, inventive samples 1-1through 1-4 provides excellent exposure image visualization, excellent printing performance and excellent handling property without exposure device contamination. Inventive sample 1-5, although exposure image visualization is poor, provides excellent printing performance and excellent handling property without exposure device contamination, and is a printing plate material suitable for a DI printing press.

Example 2

(Preparation of Printing Plate Material)

The above-obtained coating solution was coated on the substrate obtained above employing a wire bar to obtain a combination as shown in Table 5, and dried to give an image formation layer having a dry thickness as shown in Table 4. Thus, inventive and comparative printing plate material samples were prepared.

The coated hydrophilic layer was dried at 80° C. for 3 minutes, and then further aged at 60° C. for 24 hours. The coated image formation layer was dried at 55° C. for 3 minutes, and then further aged at 55° C. for 24 hours.

(Image Formation)

Image formation was carried out by infrared laser exposure. Exposure was carried out employing an infrared laser (having a wavelength of 830 nm and a beam spot diameter of 18 μm) at an exposure energy of 400 mJ/$cm^2$, at a resolution of 2400 dpi and at a screen line number of 175 to form an image, the beam being focused on the surface of the image formation layer. A solid image and an image with a dot area of from 1 to 99% were employed as an image for evaluation. Evaluation was carried out in the same manner as in Example 1. The results are shown in Table 5.

TABLE 4

| | Sample No. | | | | | | |
|---|---|---|---|---|---|---|---|
| | Inventive sample 1-1 | Inventive sample 1-2 | Inventive sample 1-3 | Inventive sample 1-4 | Inventive sample 1-5 | Comparative sample 1-1 | Comparative sample 1-2 |
| Substrate | 1 | 1 | 1 | 1 | 1 | 1 | 1 |
| Hydrophilic layer coating solution | 1 | 2 | 3 | 2 | 3 | 4 | 4 |
| Hydrophilic layer coating amount (g/m2) | 1.0 | 1.5 | 1.5 | 2.0 | 1.0 | 1.5 | 1.5 |
| Image formation layer coating solution | 1 | 2 | 3 | 3 | 4 | 3 | 5 |
| Image formation layer coating amount (g/m2) | 0.6 | 1.0 | 1.0 | 1.5 | 1.0 | 1.0 | 1.5 |
| Exposure image visualization | C | B | A | A | D | D | B |
| Exposure device contamination | A | B | B | B | B | B | D |
| Colored material wiped off with water | A | B | B | B | B | B | D |
| Initial printability | B | A | A | A | A | *No image | B |
| Scratch resistance | B | A | A | A | A | A | B |

*No image was formed on prints.

TABLE 5

| | Sample No. | | | | | | |
|---|---|---|---|---|---|---|---|
| | Inventive sample 2-1 | Inventive sample 2-2 | Inventive sample 2-3 | Inventive sample 2-4 | Inventive sample 2-5 | Comparative sample 2-1 | Comparative sample 2-2 |
| Substrate | 2 | 2 | 3 | 3 | 2 | 2 | 3 |
| Hydrophilic layer coating solution | 3 | 2 | 3 | 2 | 3 | 4 | 4 |
| Hydrophilic layer coating amount (g/m2) | 0.8 | 1.0 | 1.2 | 1.0 | 1.0 | 0.8 | 0.8 |
| Image formation layer coating solution | 3 | 3 | 2 | 2 | 4 | 5 | 6 |
| Image formation layer coating amount (g/m2) | 1.0 | 0.8 | 1.0 | 1.0 | 1.0 | 1.0 | 1.0 |
| Exposure image visualization | C | C | B | C | D | C | D |
| Exposure device contamination | B | B | B | B | B | D | B |
| Colored material wiped off with water | B | A | B | B | B | D | B |
| Initial printability | A | A | A | A | A | B | C |
| Scratch resistance | A | A | A | A | A | A | D |

As is apparent from Table 5 above, the inventive printing plate material samples provide excellent performances, even when a surface-roughened aluminum plate was used as a substrate.

EFFECT OF THE INVENTION

The present invention can provide a printing plate material providing excellent initial printability, excellent scratch resistance, and excellent exposure image visualization, and an image formation method free from contamination of a printing press when printing is carried out employing a development-on-press type printing plate materials.

What is claimed is:

1. A printing plate material comprising a substrate and provided thereon, a component layer comprising a hydrophilic layer and an image formation layer, the hydrophilic layer being provided closer to the substrate than the image formation layer, wherein the hydrophilic layer contains an electron providing dye precursor, the image formation layer contains an organic electron accepting developing agent, and the component layer contains a light heat conversion material.

2. The printing plate material of claim 1, wherein the image formation layer contains a heat melting material with a melting point of 60 to 200° C.

3. The printing plate material of claim 2, wherein the heat melting material is such that it alone does not exhibit ink receptivity, and when it is heat melted and mixed with the electron providing dye precursor or the electron accepting developing agent, it exhibits ink receptivity.

4. The printing plate material of claim 3, wherein the heat melting material is a fatty acid amide.

5. The printing plate material of claim 1, wherein the image formation layer contains a water soluble material.

6. The printing plate material of claim 1, wherein the hydrophilic layer is porous.

7. The printing plate material of claim 1, wherein the electron providing dye precursor has a melting point of 50 to 300° C., and the electron accepting developing agent has a melting point of 50 to 300° C.

8. The printing plate material of claim 7, wherein the electron providing dye precursor has a melting point of 100 to 200° C., and the electron accepting developing agent has a melting point of 100 to 200° C.

9. The printing plate material of claim 1, wherein the coating amount of the electron providing dye precursor is from 0.05 to 1 $g/m^2$ of the printing plate material.

10. The printing plate material of claim 1, wherein the amount of the organic electron accepting developing agent is from 0.05 to 2 $g/m^2$ of the printing plate material.

11. The printing plate material of claim 1, wherein the hydrophilic layer contains a metal oxide having an average particle size of from 3 to 100 nm.

12. An image formation method comprising the steps of:

exposing the printing plate material of claim 1, employing an infrared laser;

melting the organic electron accepting developing agent at exposed portions so that the melted agent permeates the hydrophilic layer to form a color image in the hydrophilic layer; and then removing the image formation layer at unexposed portions.

13. The image formation method of claim 12, wherein the removing is carried out on a printing press employing a dampening water or a printing ink.

14. The image formation method of claim 12, wherein the exposing is carried out employing infrared laser installed in a printing press.

* * * * *